United States Patent [19]

Korsunsky et al.

[11] Patent Number: 4,941,832
[45] Date of Patent: Jul. 17, 1990

[54] LOW PROFILE CHIP CARRIER SOCKET

[75] Inventors: Iosif Korsunsky, Harrisburg; Monte L. Kopp, Tower City; Dimitry G. Grabbe, Middletown, all of Pa.

[73] Assignee: AMP Incorporated, Harrisburg, Pa.

[21] Appl. No.: 302,305

[22] Filed: Jan. 30, 1989

[51] Int. Cl.$^5$ ............................................. H01R 9/09
[52] U.S. Cl. ..................................... 439/71; 439/72; 439/884
[58] Field of Search ..................... 439/71–73, 439/76, 77, 80–84, 828, 870, 876, 884, 885

[56] References Cited

U.S. PATENT DOCUMENTS

| | | | |
|---|---|---|---|
| 3,951,495 | 4/1976 | Donaher et al. | 439/71 |
| 4,050,755 | 9/1977 | Hasircoglu | 439/71 |
| 4,089,575 | 5/1978 | Grabbe | 339/17 |
| 4,354,729 | 10/1982 | Grabbe et al. | 339/258 |
| 4,491,378 | 1/1985 | Crawford | 439/71 |
| 4,504,887 | 3/1985 | Bakermans et al. | 361/399 |
| 4,511,197 | 4/1985 | Grabbe et al. | 339/17 |
| 4,513,353 | 4/1985 | Bakermans et al. | 361/399 |
| 4,538,864 | 9/1985 | Ichimura | 339/17 |
| 4,630,875 | 12/1986 | Korsunsky et al. | 339/17 |
| 4,642,872 | 2/1987 | Grabbe et al. | 29/564 |
| 4,645,279 | 2/1987 | Grabbe et al. | 339/17 |
| 4,647,124 | 3/1987 | Kandybowski | 339/17 |
| 4,679,319 | 7/1987 | Grabbe et al. | 29/843 |
| 4,679,871 | 7/1987 | Egawa | 439/72 |
| 4,684,184 | 8/1987 | Grabbe et al. | 439/71 |
| 4,699,593 | 10/1987 | Grabbe et al. | 439/71 |
| 4,710,134 | 12/1987 | Korsunsky | 439/264 |
| 4,746,299 | 5/1988 | Matsuoka et al. | 439/70 |

FOREIGN PATENT DOCUMENTS 3633799 4/1988 Fed. Rep. of Germany ...... 439/884

OTHER PUBLICATIONS

European Patent Office Search Report, 8-23-89.

Primary Examiner—P. Austin Bradley
Attorney, Agent, or Firm—Bruce J. Wolstoncroft

[57] ABSTRACT

A chip carrier socket has terminals (2) positioned therein to provide an electrical connection between a chip carrier (4) and a substrate (6). The terminals (2) have first arms (10) which cooperate with the chip carrier (4), second arms (12) which engage the housing of the chip carrier socket, and mounting arms (32) which are placed in electrical engagement with the substrate (6). Engagement means (38) are provided between the first arms (10) and the mounting arms (32), and provide a shortened path across which the electrical signals can travel from the chip carrier to the substrate. The engagement means (38) also provide a frictional engagement between the first arms (10) and the mounting arms (32), thereby reducing the resilient characteristics required in the mounting arms. This frictional engagement provided by the engagement means (38) is sufficient to insure that an adequate mating force is provided between the mounting arms (32) and the substrate (6), even if the substrate (6) is warped by environmental conditions.

18 Claims, 4 Drawing Sheets

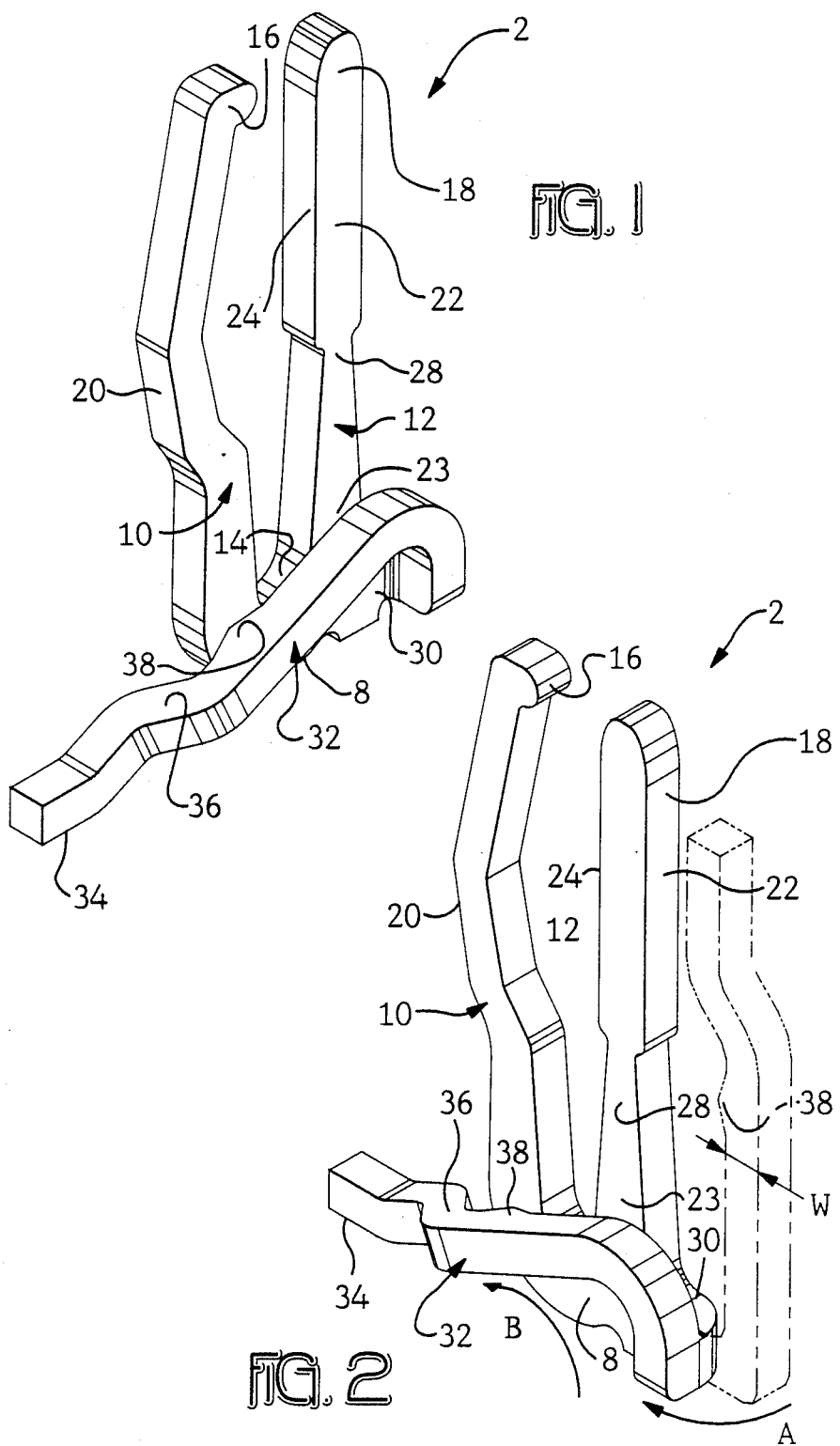

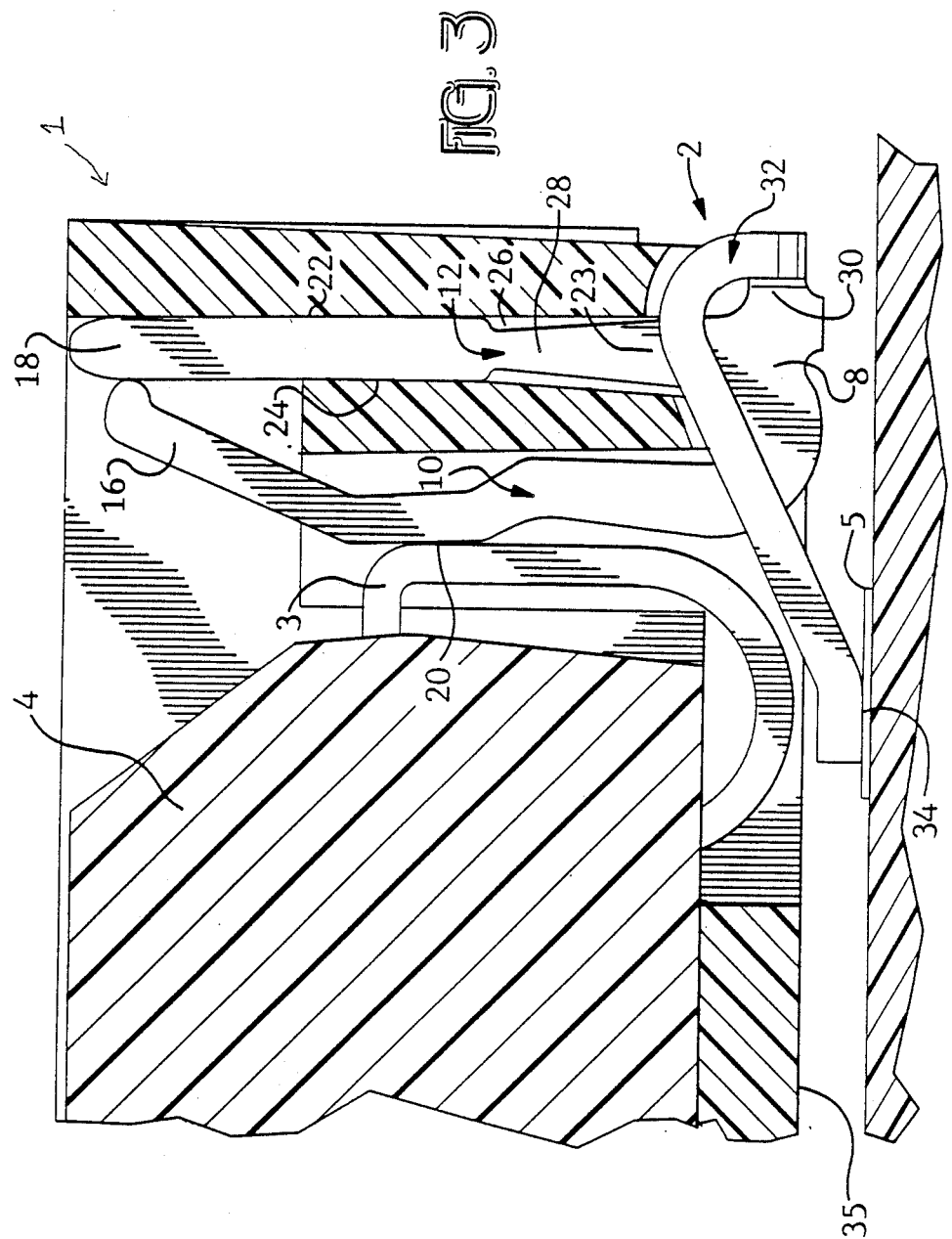

LOW PROFILE CHIP CARRIER SOCKET

FIELD OF THE INVENTION

The invention relates to chip carrier sockets which are configured to fit into a confined area. The invention is particularly concerned with providing a low profile chip carrier socket in which adequate contact force of the terminals is obtained against terminal pads on a chip carrier in the socket notwithstanding dimensional variations in the chip carrier as a result of manufacturing tolerances.

SUMMARY OF THE INVENTION

Integrated circuits are commonly mounted in chip carriers which are bodies of insulating material having side surfaces to which conductors from the integrated circuit extend. Terminal pads are provided on the side surfaces of the chip carrier body and contact is made with these pads to connect the integrated circuit to conductors on a substrate such as a ceramic substrate or a circuit board. Contact is usually established with the terminal pads on the chip carrier by means of a chip carrier socket which comprises a socket body having a recess which receives the chip carrier and contact terminals in surrounding relationship to the recess so that when the chip carrier is placed in the recess, the contact terminals contact the terminal pads of the chip carrier.

Notwithstanding the relatively small size of the chip carrier socket and the contact terminals in the socket, it is necessary that each terminal be capable of exerting a substantial contact force on a respective terminal pad in a chip carrier in order to establish good electrical contact between the contact terminal and the terminal pad on the chip carrier, particularly if the terminal pad is tin plated rather than gold plated. Finally, chip carriers and chip carrier sockets are subject to the dimensional variations of all mass produced parts which result from manufacturing tolerances and the design and performance requirements of the chip carrier socket must be satisfied even in "worst case" conditions.

It can be appreciated from the foregoing remarks that many of the types of contact terminals used in prior art connectors are not suitable for use in chip carrier sockets and would not satisfy the requirements of a chip carrier socket terminal. However, U.S. Pat. No. 4,645,279 describes a chip carrier socket with improved contact terminals. As is evident from the specification, the configuration of the chip carrier socket permits the achievement of a high contact force and is capable of accommodating manufacturing tolerances in the chip carrier while maintaining the required contact force.

The type of socket described in the above-referenced patent has advantages in many situations. However, in instances in which the chip carrier socket is to be used in an area in which the overall height of the socket is to be minimized, and in instances in which the socket is to be surface mounted to a printed circuit or the like, the socket of the −279 patent is not adequate. The configuration of the terminals of the chip carrier socket requires that space be provided for the mounting portion of the terminals. In other words, the height of the chip carrier socket is greater than the height of the housing. This is an unacceptable result when the space of the printed circuit board is at a premium.

However, if the posts are removed to produce a surface mount version, the mounting area of the terminals does not have the resilient characteristics required to insure that the mounting areas of the terminals will remain in electrical engagement with the contact traces provided on the printed circuit board. In light of this problem, terminals have been designed with mounting areas which have resiliency provided therein. These mounting areas adequate in some instances, but are less than adequate in others. As the resiliency of the mounting areas is provided by the spring characteristics of the material, it is conceivable that the spring member when subjected to large deflection caused by the insertion of an oversized chip carrier will take a permanent set, thereby preventing the terminals from being effective over many uses or when a valid but lower limit dimensioned part is inserted after and oversized part. Also, in order to increase the spring characteristics, the length of the mounting areas is generally increased, which causes the electrical path over which the signals travel to be lengthened, thereby increasing propagation delays.

It would therefore be advantageous to provide a terminal for use in a chip carrier socket and the like, which would have the resilient characteristics required to compensate for board warpage or oversized parts over many cycles of the socket (i.e. prevent the resilient means of the terminal from taking a permanent set). In so doing, it would also be beneficial to provide a shortened electrical path over which the signals are to travel, in order to minimize the propagation delays and self inductance associated with the chip carrier socket contact.

The invention relates to a terminal, for use in a chip carrier socket of the like, which compensates for warpage of the printed circuit board to which the socket is to be attached. The configuration of the terminal insures that a reliable electrical connection will be effected, even after the socket has been used for many cycles.

The invention is directed to an electrical terminal for use in connecting a first electrical component with a second electrical component. The electrical terminal has a first component engagement portion and a second component engagement portion provided thereon. The first component engagement portion is moveable with respect to the second component engagement portion between a first and a second position.

An engagement means extends between the first component engagement portion and the second engagement portion. The engagement means has respective ends which are provided in electrical engagement with the engagement portions, such that the engagement means provides an electrical path across which electrical signals may travel between the first and the second component engagement portions. Whereby as the first component engagement portion is moved between the first and the second position, the engagement means is caused to frictionally engage a respective engagement portion.

Another embodiment of the invention is directed to a chip carrier socket for an integrated circuit chip carrier. The chip carrier has a chip carrier body which has oppositely facing major surfaces and outwardly facing chip carrier side surfaces which extend essentially normal to the major surfaces, and spaced apart contact pads on the chip carrier side surfaces. The socket has a socket body with oppositely facing first and second surface portions. A recess is provided in the first major surface for reception of the chip carrier, the recess having recess side surfaces which extend inwardly from the first major surface. Contact receiving cavities are positioned in the socket body in surrounding relationship to the recess, each cavity has opposed sidewalls which extend inwardly from the adjacent recess side surface and an inner end surface which is remote from the recess side surface. A contact terminal is provided in each of the cavities, each terminal having a chip carrier contacting portion for contacting a respective contact pad on the chip carrier.

Each contact terminal has a substrate contacting portion provided proximate to the second major surface. The substrate contacting portion has a contact leg which extends from the chip carrier contacting portion, the contact leg being formed so that the contact leg extends in a plane which is essentially parallel to the plane of the chip carrier contacting portion. A substrate engagement surface is provided at a free end of each contact leg.

Each contact leg has an engagement means provided thereon, the engagement means extends from the contact leg toward the chip carrier contacting portion. A free end of the engagement means is provided in physical engagement with the chip carrier contacting portion. Whereby as the chip carrier socket is placed in electrical engagement with the substrate, the substrate engagement surfaces of the contact legs of the terminals engage the conductive traces of the printed circuit board, causing the contact legs to move to a stressed position, thereby causing the engagement means to frictionally slide across chip carrier contacting portion.

BRIEF DESCRIPTION OF THE DRAWINGS

FIG. 1 is an isometric view of a respective terminal of the present invention.

FIG. 2 is an isometric view of the respective terminal, the lines drawn in phantom indicating the position of a mounting leg prior to forming.

FIG. 3 is a cross-sectional view of a housing into which the terminals are inserted, showing a chip carrier fully inserted into the housing of a chip carrier socket and the terminals of the chip carrier socket in electrical engagement with the printed circuit board.

DETAILED DESCRIPTION OF THE INVENTION

Figure 4:
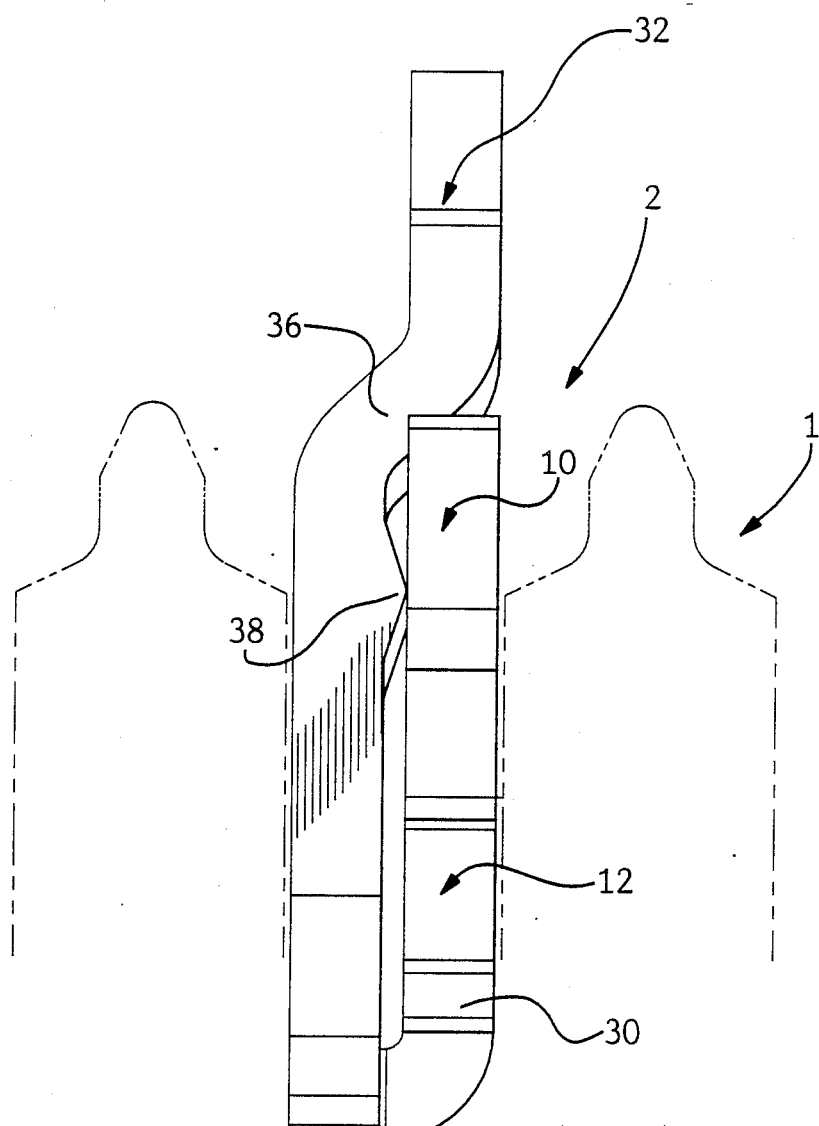
FIG. 4 is a top view of a respective terminal inserted in a terminal receiving recess of the housing of the chip carrier socket.

FIG. 3 shows a cross-sectional view of a chip carrier socket 1 containing terminals 2 which contact conductive leads 3 on a chip carrier 4, and which are soldered or otherwise connected to conductors 5 on or in a substrate 6. For ease of explanation and understanding, a representative terminal will be described, afterwhich the chip carrier socket with a plurality of terminals provided therein will be discussed.

Each terminal 2 is a complanate or flat member of the type commonly produced by etching or by stamping sheet metal so that it has oppositely facing major surfaces and edges extending between the major surfaces. The thickness of the terminal may vary from about 0.004 inches to about 0.020 inches, depending upon the requirements in a particular situation.

Each contact terminal comprises a web portion 8 having first and second arms 10, 12 extending therefrom at an upper edge 14 of the web portion 8. The arms 10, 12 have free upper ends 16, 18 which are spaced apart but which are flexed relatively towards each other when the terminal is stressed.

The first arm 10 is a contact arm and has a leftwardly facing, as best shown in FIGS. 1 and 3, contact surface portion 20 with which a respective conductive lead 3 of the chip carrier 4 will cooperate. The second arm 12 has a rightwardly facing bearing edge surface 22 adjacent to its upper end and a leftwardly facing bearing edge surface 24. Each bearing edge surface 22, 24 is freely supported by a respective surface of a recess 26 (FIG. 3) into which the second arm 12 is positioned. The term "freely supported" is used to emphasize the fact that the upper end portion of the second arm 12 cannot move in a direction which is normal to its longitudinal axis, but the terminal is free to move in a direction which is parallel to the axis. Consequently, the second arm is free to move upwardly or downwardly along the surfaces of the recess 26.

The intermediate portion 28 of the second arm, which is between the free end and a lower end 23 thereof, is capable of flexure rightwardly from the position shown in FIG. 1 when the terminal is positioned in a chip carrier socket, and for this purpose, the intermediate portion 28 is spaced from the surface of the recess 26 (FIG. 3). In order to facilitate the flexure, the intermediate section has a reduced width.

A detailed description of the manner is which the web portion 8 and the first and second arms 10, 12 cooperate is provided in U.S. Pat. No. 4,645,279, the disclosure of which is hereby incorporated by reference. Therefore, a detailed description of the operation of these parts of the terminal will not be provided.

The web portion 8 has an extension 30 extending rightwardly therefrom, as best shown in FIG. 4. A mounting arm 32 extends from the extension, to provided the means to position the terminal of the chip carrier socket in electrical engagement with a respective conductor 5 of the substrate 6.

As is illustrated in FIG. 2, each terminal 2 is stamped from sheet metal so that the first arm 10, the second arm 12, and the mounting arm 32 are all provided in the same plane. The position of the mounting arm after stamping is indicated by the lines drawn in phantom in FIG. 2. Prior to the terminal being inserted into the housing of the chip carrier socket, the mounting arm is bent in the direction indicated by the arrow labeled A in the figure. This moves the mounting arm into an intermediate position in which a significant portion of the mounting arm 32 lies in a plane which is parallel to the plane of the first and second arms 10, 12. From this intermediate position, the mounting arm 32 is bent in the direction indicated by arrow B. In this final formed position, the mounting arm has a generally J-shaped configuration, as best shown in FIG. 3.

Figure 5:
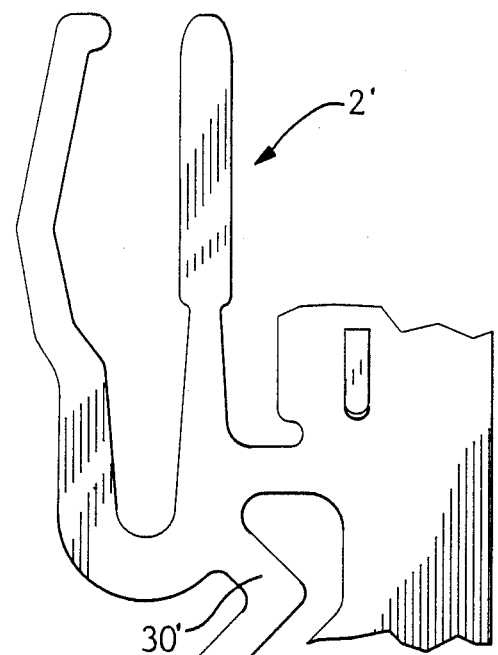
FIG. 5 is a side view of an alternative embodiment of the terminal, showing the terminal in a stamped but unformed configuration.
Figure 6:
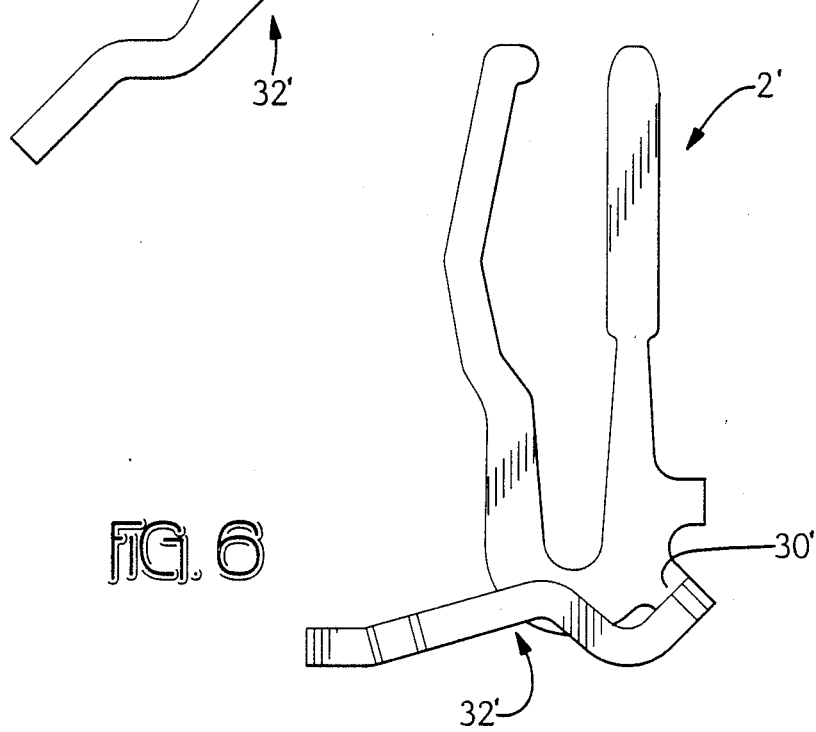
FIG. 6 is a view similar to FIG. 5, showing the terminal in a stamped and formed configuration and removed from a carrier strip.

FIGS. 5 and 6 illustrate an alternative embodiment of the terminal 2'. As is shown, the terminal is essentially identical to that shown in FIGS. 1 and 2, with the exception the mounting arm 32 ' is stamped in a different position 30 '. However, after the forming operation, the terminal acts in an identical manner to the terminal described in FIGS. 1 through 4.

In this formed position, a substrate mating surface 34 of the mounting arm 32 extends below the plane of the bottom surface of the web portion 8, as viewed in FIG.

3. In fact, the mating surface 34 of the mounting arm extends below the plane of the second major surface 35 of the chip carrier socket 1, thereby enabling the chip carrier socket to be surface mounted to the printed circuit board.

In the embodiment shown in FIG. 4, each mounting arm 32 has a transition portion 36 in which the mounting arm is bent. This enables the respective mounting surface to be positioned in the same plane as the first and second arms 10, 12 of the terminal. However, it should be noted that the positioning of the mounting surface 34 in the same plane as the arms 10, 12 is not always required. The position of the mounting surfaces is determined by the arrangement of the conductors 5 on the circuit board 6. Consequently, the configuration of the transition portion can vary according to the specific requirements of the conductors on the printed circuit board.

Referring back to FIG. 2, when each terminal is stamped from a piece of sheet metal, the mounting arm 32 is made to have a generally consistent width W. However, an increased width can be provided at an engagement portion 38. As best shown in FIGS. 1 and 4, after the terminal is stamped and formed, the engagement portion 38 of each mounting arm 32 is placed in both electrical and mechanical engagement with the first arm 10.

Providing the engagement portion 38 of each mounting arm 32 in engagement with the first arms 10 is an important feature. Due to the configuration of the terminals 2, the path over which electrical signals must travel from the contact surface portions 20 to the mating surfaces 34 would be significant if not for the electrical engagement between the engagement portions 38 and the first arms 10. Causing the electrical signals to travel over a lengthy path is undesirable due to the self-inductance associated therewith. Therefore, providing a shortened electrical path across the engagement portion of each terminal reduces the propagation delay of the signals, as well as increases the reliability of the signals.

The engagement portions 38 are also provided in mechanical engagement with first arms 10. The configuration of the mounting arms 32 and the material used to produce the mounting arms insures that the mounting arms have resilient characteristics associated therewith. It is essential that the mounting arms 32 have these resilient characteristics in order for the terminals of the chip carrier socket to be provided in electrical engagement with the conductors 5 of the printed circuit board 6. In other words, the narrow width of the printed circuit board allows the board to easily warp. The resiliency is necessitated due to the great likelihood that the printed circuit board will be bent or warped in some manner. As the printed circuit board is sometimes long and slender, the board can easily warp or deform when exposed to various environmental conditions. Consequently, it is essential that the mounting arms 32 of the terminals 2 be able to compensate for the warpage of the board in order to insure that a positive electrical connection is effected between each terminal and a respective conductor. Therefore, it is important for the mounting arms to have the required resilient characteristics.

It is sometimes difficult to provide resilient characteristics which are adequate to insure that a proper electrical connection will be effected between the mounting surfaces and the conductors of the board. This is particularly true in a chip carrier socket in which it is important to keep the overall height at a minimum. Due to the restrictions as to the size of the chip carrier socket, the mounting portions of the terminals can not occupy a significant amount of space, and therefore, the mounting portions can not have a configuration in which the resilient characteristics can be enhanced by the shape of the terminals.

Consequently, in order to enhance the resilient characteristics and the contact force provided between the mounting surfaces 34 and the conductors 5, engagement portions 38 of the mounting arms 32 are provided to frictionally engage the first arms 10 as the mounting surfaces 34 contact the conductors 5 of the board 6. The frictional engagement between the engagement portions and the first arms creates a force which opposes the movement of the mounting arms from a first position to a second position.

As the chip carrier socket 1 is moved into engagement with the printed circuit board 6, the mounting surfaces 34 engage the conductor 5. However, due to the deformation of the board, it is likely that the initial engagement will not place all of the terminals in electrical engagement with the conductors. Therefore, the housing of the chip carrier socket is continued to be moved toward the circuit board. The continued movement of the socket causes the mounting portions 32 which are in engagement with the conductors 5 to deform relative to the respective first arms 10. The deformation occurs as the mounting portions 32 are moved in a direction toward free ends 16, 18 of arms 10, 12. As the mounting portions 32 are moved upward, when viewed in FIG. 3, the engagement portions 38 are forced to slide along a surface of first arm 10. This frictional engagement between the engagement portions and the first arms provides a force which resists the movement of the mounting portions 32. This force will be transmitted to the mounting surfaces 34, such that the mounting surfaces will apply a significant contact force to the conductors 5 of the circuit board 6. The movement of the chip carrier socket toward the board is discontinued when all of the mounting surfaces 34 are provided in electrical engagement with the conductors 5 of circuit board 6. It should be noted, that the increased force associated with the mounting surfaces 34 insures that the mounting surfaces will be maintained in electrical engagement with the conductors of the printed circuit board, no matter how much the board is warped.

Several advantages are obtained by placing the engagement portion 38 in electrical and mechanical engagement with first arm 10. Due to the fact that the engagement portions of the mounting arms frictionally engage the first arms when the mounting arms are moved, the resilient characteristics of the mounting arms do not have to be as prevalent. In other words, the frictional engagement between the mounting arms and first arms is sufficient to provide an adequate mating force between the mounting surfaces 34 and conductors 5. Therefore, as the resiliency of the mounting arms are not responsible for supplying the contact force, the resilient characteristics do not have to be as great as in previous terminals. Consequently, the mounting arms can be configured in various ways which were not practical before.

Also, as the frictional engagement is a prevalent characteristic, it is much more difficult for the mounting arms to take a permanent set. In other words, as the spring characteristics of the mounting arms are not responsible for providing the force required to insure a positive electrical connection between the mounting surfaces and the conductors, the spring rate of the mounting arms can be lessened, thereby requiring a much greater deflection of the mounting arms before they take a permanent set.

The frictional engagement between the engagement portions and the first arms is also important to insure that a positive electrical connection is effected between the engagement portions and the first arms. As the engagement portions are forced to slide across the first arms, a wiping action is provided. This wiping action insures that all of the layers of corrosion, etc. will be removed from the contact areas between the engagement portions and the first arms, thereby insuring that a positive electrical connection will be effected therebetween.

Consequently, the use of the engagement portions not only insures that a reliable electrical connection is effected, but also insures that a positive electrical connection will be effected over many cycles without failure. This is due to the fact that the mounting arms will not take a permanent set and the mounting force provided by the frictional engagement of the mounting arms with the first arms will be consistently maintained over many cycles.

Changes in construction will occur to those skilled in the art and various apparently different modifications and embodiments may be made without departing from the scope of the invention. The matter set forth in the foregoing description and accompanying drawings is offered by way of illustration only. It is therefore intended that the foregoing description be regarded as illustrative rather than limiting.

We claim:

1. A chip carrier socket for an integrated circuit chip carrier, the chip carrier comprising a chip carrier body having oppositely facing major surfaces and outwardly facing chip carrier side surfaces which extend normally of the major surfaces, and spaced apart contact pads on the chip carrier side surfaces, the socket comprising a socket body having oppositely facing first and second surface portions, a recess in the first major surface for reception of the chip carrier, the recess having recess side surfaces which extend inwardly from the first major surface, contact receiving cavities in the socket body in surrounding relationship to the recess, each cavity having opposed sidewalls extending inwardly from the adjacent recess side surface and an inner end surface which is remote from the recess side surface, a contact terminal in each of the cavities, each terminal having a chip carrier contacting portion for contacting a respective contact pad on the chip carrier, the chip carrier socket comprising:

each contact terminal has a substrate contacting portion provided proximate to the second major surface, the substrate contacting portion having a contact leg which extends from the chip carrier contacting portion, the contact leg being formed so that the contact leg extends in a plane which is essentially parallel to the plane of the chip carrier contacting portion, the contact leg having a substrate engagement surface provided at a free end thereof;

each contact leg has an engagement means provided thereon, the engagement means extends from the contact leg toward the chip carrier contacting portion, a free end of the engagement means is provided in physical engagement with the chip carrier contacting portion;

whereby as the chip carrier socket is placed in electrical engagement with the substrate, the substrate engagement surfaces of the contact legs of the terminals engage conductive traces of a printed circuit board, causing contact legs to move to a stressed position, thereby causing the engagement means to frictionally slide across chip carrier contacting portion.

2. A chip carrier socket as recited in claim 1 wherein the contact leg has a transition section, the transition section having a bend provided therein to insure the substrate engagement surface is provided in the proper position relative to conductors of a mating printed circuit board.

3. A chip carrier socket as recited in claim 1 wherein each contact terminal is stamped and formed sheet metal member, the major surfaces being rolled surfaces, the edges being sheared edges.

4. A chip carrier socket as recited in claim 3 wherein the engagement means is a portion of the contact leg which has an increased cross-sectional area.

5. A chip carrier socket for electrically connecting an integrated circuit chip carrier to an electrical component, the chip carrier socket comprising:

a socket body having a plurality of contact terminal receiving cavities provided therein;

a plurality of contact terminals positioned in the contact terminal receiving cavities, each contact terminal having a component engagement portion and a chip carrier engagement portion, the component engagement portion extends outward from the contact receiving cavities, the component engagement portion being moveable from a first position to a second position relative to the chip carrier engagement portion;

each component engagement portion and respective chip carrier engagement portion has an engagement means which extends therebetween, the engagement means has respective ends which are provided in electrical engagement with the component engagement portions and chip carrier engagement portions, such that the engagement means provides an electrical pathway across which electrical signals may travel;

whereby as the component engagement portion is moved between the first and the second position, the engagement means is caused to frictionally engage a respective engagement portion.

6. A chip carrier socket as recited in claim 5 wherein the electrical component is a printed circuit board, with conductors provided therein.

7. A chip carrier socket as recited in claim 5 wherein each contact terminal is stamped and formed from sheet metal, the major surfaces being rolled surfaces, the edges being sheared edges.

8. A chip carrier socket as recited in claim 5 wherein fixed ends of the engagement means are integral with the component engagement portions, and free ends of the engagement means are provided proximate the chip carrier engagement portions, such that as the component engagement portions are moved between the first and the second position, the free ends of the engagement means are caused to frictionally engage respective surfaces of the chip carrier engagement portions, thereby causing the engagement means to provide a wiping action against the chip carrier engagement portions as the component engagement portions are moved.

9. A chip carrier socket as recited in claim 8 wherein each of the engagement means has a contact leg which has a component engagement surface provided thereon.

10. A chip carrier socket as recited in claim 9 wherein a transition section is provided on each contact leg, each transition section having a bend provided therein to insure that the substrate engagement surfaces are provided in alignment with respective conductors of the electrical component.

11. A chip carrier socket as recited in claim 9 wherein each engagement means is a portion of a respective contact leg, the engagement means having an increased cross-sectional area.

12. An electrical terminal for use in connecting a first electrical component with a second electrical component, the electrical terminal comprising:
   a first component engagement portion and a second component engagement portion, the first component engagement portion being moveable with respect to the second component engagement portion between a first and a second position;
   the first component engagement portion extends from the second engagement portion such that the first component portion is provided in a first plane which is adjacent to and essentially parallel, to a second plane in which the second component engagement portion is positioned.
   an engagement means extends between the first component engagement portion and the second engagement portion, the engagement means has respective ends which are provided in electrical engagement with the engagement portions, such that the engagement means provides an electrical path across which electrical signals may travel;
   whereby as the first component engagement portion is moved between the first and the second position, the engagement means is caused to frictionally engage a respective engagement portion.

13. An electrical terminal as recited in claim 12 wherein the first electrical component is a printed circuit board with conductors provided therein, and the second electrical component is a chip carrier with leads extending from edges thereof.

14. An electrical terminal as recited in claim 12 wherein the electrical terminal is stamped and formed from sheet metal, the major surfaces being rolled surfaces, the edges being sheared edges.

15. An electrical terminal as recited in claim 12 where in a fixed end of the engagement means is integral with the first engagement portion, and a free end of the engagement means is provided proximate the second engagement portion, such that as the first engagement portion is moved between the first and the second position, the free end of the engagement means is caused to frictionally engage a surface of the second engagement portion, thereby causing the engagement means to provide a wiping action against the second engagement portion as the first engagement portion is moved.

16. An electrical terminal as recited in claim 15 wherein the engagement means has a contact leg which has a first component engagement surface provided thereon.

17. An electrical terminal as recited in claim 16 wherein a transition section is provided on the contact leg, the transition section having a bend provided therein to insure that the first component engagement surface is provided in alignment with conductors of the first electrical component.

18. An electrical terminal as recited in claim 16 wherein the engagement means is a portion of the contact leg which has an increased cross-sectional area.

* * * * *